United States Patent [19]
Quek et al.

[11] Patent Number: 5,488,244
[45] Date of Patent: Jan. 30, 1996

[54] ELECTRICALLY ERASABLE AND PROGRAMMABLE READ ONLY MEMORY CELL

[75] Inventors: Elgin K. B. Quek, Singapore, Singapore; Brian E. Cronquist, San Jose, Calif.; Che C. Wei, Singapore, Singapore

[73] Assignee: Chartered SimiConductor Manufacturing PTE Ltd., Singapore

[21] Appl. No.: 394,786

[22] Filed: Feb. 27, 1995

[51] Int. Cl.$^6$ .......................... H01L 29/76; H01L 21/265
[52] U.S. Cl. .......................... 257/314; 257/315; 257/316; 257/324; 257/332; 257/412; 437/43; 437/186; 437/196; 437/203; 437/233; 437/913
[58] Field of Search .......................... 257/314, 315, 257/316, 324, 332, 412; 437/43, 186, 196, 203, 233, 913

[56] References Cited

U.S. PATENT DOCUMENTS

| | | | |
|---|---|---|---|
| 4,975,383 | 12/1990 | Baglee | 437/43 |
| 5,442,214 | 8/1995 | Yang | 257/332 |

*Primary Examiner*—Edward Wojciechowicz
*Attorney, Agent, or Firm*—George O. Saile

[57] ABSTRACT

A novel design for an electrically erasable and programmable read only memory device is described. Particular features of the design include a floating gate that is partly located beneath the surface and and an efficient electron emitter to facilitate electron transfer between floating and control gates. The method for constructing the device is disclosed in detail.

24 Claims, 5 Drawing Sheets

ELECTRICALLY ERASABLE AND PROGRAMMABLE READ ONLY MEMORY CELL

BACKGROUND OF THE INVENTION (1) Field of the Invention

The invention relates to a new design for an electrically erasable and programmable read only memory device of the flash type, formed within a semiconductor body, and the method for building the device.

(2) Description of the Prior Art

Conventional Field Effect Transistor (FET) devices consist of a source, a drain, and a control gate. These devices, when used in memory structures, are classified as volatile since they remain 'on' or 'off' only for as long as external voltage is applied to the control gate. In Electrically Erasable and Programmable Read Only Memories (EEPROMs), what was formerly the control gate is replaced by an (electrically) floating gate and a fourth element (the 'new' control gate) is added to the device.

When voltage is applied to the control gate of an EEPROM, charge is passed to the floating gate so that it functions in the same manner as the control gate of a conventional FET. The geometry of an EEPROM is such that, once voltage is removed from the control gate, the charge on the floating gate remains intact, a relatively large voltage in the reverse direction being required to remove said charge and thus return the floating gate to its original state.

The asymmetry in the voltages needed to charge and discharge the floating gate is accomplished by providing the floating gate with sharp points or edges and then locating the control gate in close proximity to the sharp points or edges. Because of high field emission from regions having a small radius of curvature, electrons are able to flow from the floating gate into the control gate at relatively low voltages whereas electron flow in the reverse direction is much more difficult and requires the application of substantially higher voltage.

Previous designs of EEPROMs have relied on the intersection of a diffusion region with the surface to provide the aforementioned sharp edge (see, for example, U.S. Pat. No. 4,975,383 by David A. Baglee, Dec. 4, 1990). In the present invention a novel method for creating a much sharper edge is disclosed.

Because of the need to provide good coupling between the control and floating gates, in most EEPROMs (particularly the flash type) these gates are relatively large, making for a fairly bulky overall device. In the present invention this problem is significantly reduced by designing the floating gate so that much-of it lies below the surface. A similar approach was followed by Baglee (above) but in the present invention the method for achieving this is quite different.

SUMMARY OF THE INVENTION

A novel design for an flash type EEPROM is disclosed. The surface area of the device is minimized by placing a substantial portion of the floating gate below the surface. Electron transfer between control and floating gates is enhanced by providing a sharp edged lip for the floating gate. The method for constructing the device is disclosed in detail.

DESCRIPTION OF THE PREFERRED EMBODIMENTS

Figure 1:
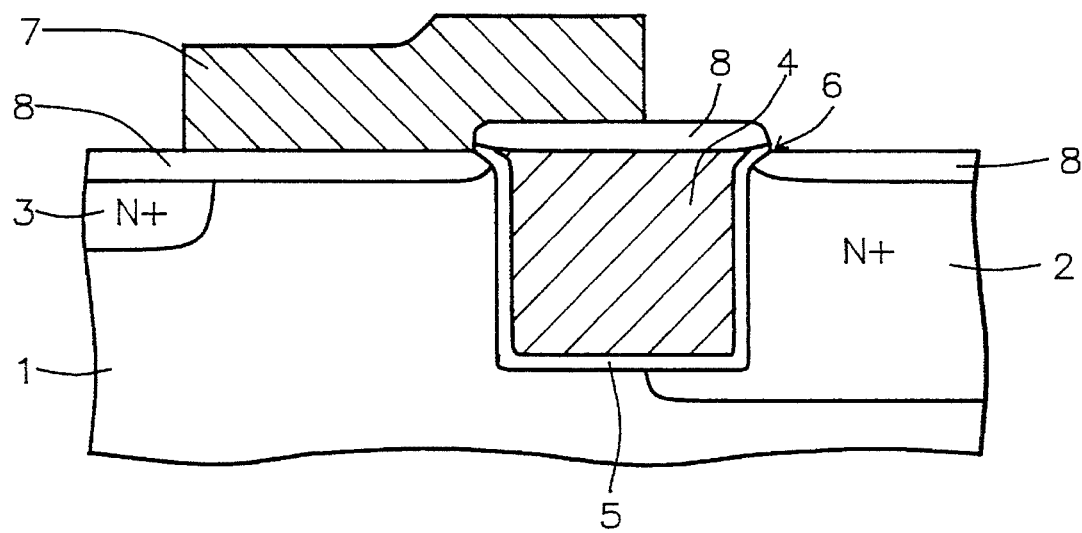
FIG. 1 is a cross-sectional view of the device showing the relative sizes and positions of its various elements.

A conventional field effect transistor (FET) is composed of a semiconductor body of one conductivity type into which two regions of the opposite conductivity type have been introduced. Electrical conduction between these two regions is normally not possible since they both form PN junctions relative to the main semiconductor body so one of the two regions will always be back-biassed. If the surface between these two regions is covered with a thin insulating layer, it is possible to change the conductivity type (near the surface) of the material located between the two regions so that conduction between them can now occur.

This change in local conductivity is effected by means of a control gate that contacts the afore-mentioned insulating layer. When voltage is applied to the control gate relative to the main semiconductor body, charge of sign opposite to the applied voltage is attracted to the surface of the semiconductor that lies beneath the control gate. Hence the local conductivity and, optionally, the local conductivity type can be changed at will by controlling the voltage that has been applied to the control gate.

Once the applied voltage has been removed from the control gate, the conductivity between the two regions of type opposite to that of the main semiconductor body (referred to as the source and drain regions respectively) reverts to its original type and magnitude. In some cases, it is desirable to be able to leave the control gate in an 'on' state, even after the applied voltage (which originally turned it on) has been removed. This is accomplished in EEPROMs by converting the control gate, as just described, to a (electrically) floating gate which, once charged relative to the main semiconductor body, retains said charge indefinitely, without connection to an external voltage source.

Charging of the floating gate in an EEPROM is accomplished by providing a fourth electrode (the control gate) which is connected to the external voltage source. The geometry of the system is such that when the control gate is electrically biased so as to be positive with respect to the floating gate, electrons from the floating gate tunnel through the layer of insulation that separates the floating and control gates, causing the floating gate to acquire a positive charge. When the control gate is turned off, the electric field between the floating and control gates is too weak for electrons to be able to flow back into the floating gate. Only if the control gate is given a sufficiently strong negative bias, relative to the floating gate, will the latter give up its earlier acquired positive charge.

In general, it is desirable that the voltage required to charge the floating gate (the electrical programming voltage) be significantly lower than the voltage that is required to neutralize it (the electrical erasing voltage). This asymmetry between the charging and discharging voltages is achieved by shaping the floating gate so that it has at least one pointed or wedge shaped region facing the control gate surface while the latter is always flat or concave relative to the floating gate.

This type of geometry allows for the easy flow of electrons out of the floating gate as a result of local high field emission at the sharp edges, while electron flow in the reverse direction requires the application of proportionately higher external voltage. It has therefore been an object of the present invention to design a device geometry that increases these high field emission effects while at the same time providing a practical method for building the device.

It should also be noted that in conventionally designed EEPROMs the requirement of placing a suitably shaped control gate above the floating gate, itself already lying above the surface, introduces a considerable degree of non-planarity to the surface of the completed device. It has therefore been a further object of the present invention to devise a means for minimizing the amount of non-planarity at the surface without sacrificing any of the device's performance parameters. This objective has been achieved, as will be shown below, together with an actual improvement in performance parameters.

Referring now to FIG. 1, there is shown a cross-section of an EEPROM that embodies the present invention. A semiconductor body 1, most commonly silicon, but not restricted to this semiconductor, provides the substrate within which the EEPROM is formed. On the right hand side of the figure is shown a source region 2 while a drain region 3 is shown on the left hand side. Both source and drain regions are of conductivity type N+. The source region extends to a greater depth below the surface than does the drain region. Typically, the source region would extend to a depth between 1.3 and 1.5 microns below the surface. Source and drain regions are separated by a distance of between 1.3 and 1.6 microns.

A floating gate 4 is located between the source and drain regions and partially overlaps the source region. The floating gate extends below the surface to a depth of between 1.1 and 1.3 microns. Surrounding the floating gate is an insulating layer 5, usually, but not necessarily, silicon oxide. The thickness of this insulating layer is usually between 130 and 170 Angstrom units. The floating gate itself is composed of polycrystalline silicon whose resistivity is between 0.002 and 0,009 ohm cm.

The floating gate 4 extends above the surrounding surface by about 480 Angstrom units, an amount sufficient to allow its upper edge to be shaped into the form of an overhanging lip that extends outwards for a distance that is not less than about 180 Angstrom units. The lip's edge is shaped so that the angle defined between its upper and lower surfaces is not greater than about 60 degrees of arc, thus ensuring that the edge will be an efficient emitter of electrons as a result of having a small radius of curvature.

Positioned above, and overlapping, both the floating gate and drain regions is a control gate 7 composed of polycrystalline silicon of resistivity between 0.0008 and 0.0012 ohm cm. Typically, the thickness of the control gate is between 0.35 and 0.45 microns. A layer of insulating material 8, commonly, but not necessarily, silicon oxide, lies between the control gate and the floating gate. The thickness of this insulating layer is typically between 0.05 and 0.07 microns.

Figure 2:
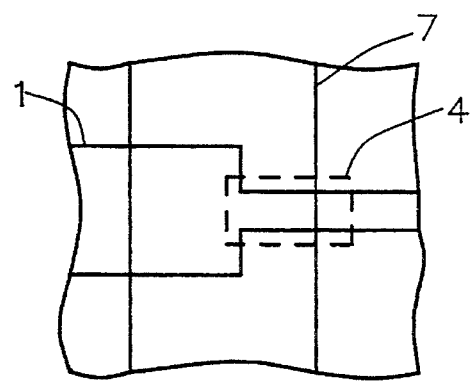
FIG. 2 is a plan view of the device shown in FIG. 1.

FIG. 2 is a plan view of the cross-section shown in FIG. 1, showing the relative positions and sizes of the source and drain regions as well as the floating and control gates.

Thus, it can be seen from FIGS. 1 and 2 that the objective of efficient electron transfer from the floating gate into the control gate at relatively low voltages, with relatively inefficient electron transfer in the reverse direction, has been achieved as a result of the sharp edged lip that forms the upper portion of the floating gate, together with its placement close to the inner surface of the control gate.

The objective of minimizing the amount of non-planarity at the surface has been achieved by locating the floating gate entirely beneath the surface (with the exception of the overhanging lip). Introduction of this geometry has the additional important advantage that the control-gate-to-floating-gate coupling ratio is reduced, leading to an improvement in the programming efficiency. This is a consequence of the fact that this geometry causes the floating-gate-to-source and floating-gate-to-substrate capacitances to increase proportionately more than the control-gate-to-floating-gate capacitance.

Figure 3:
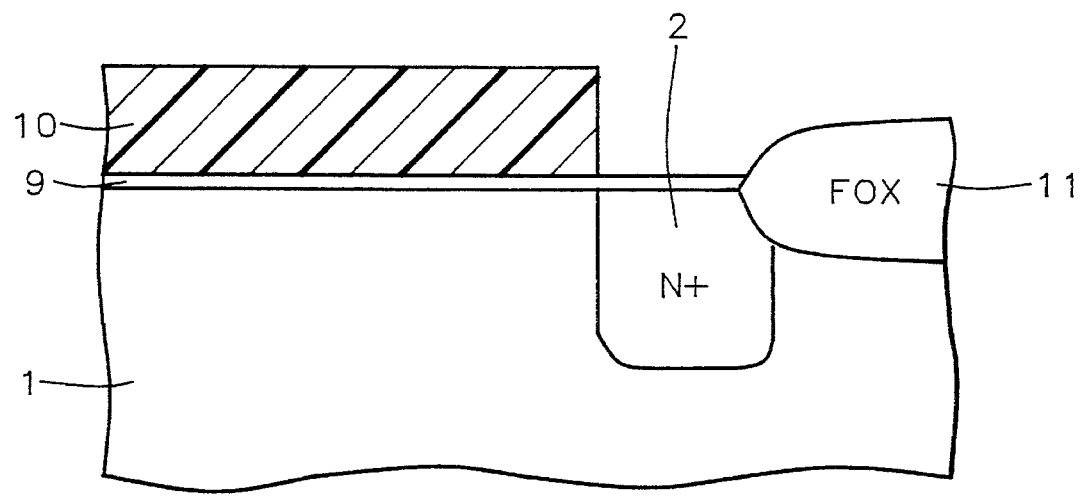
FIGS. 3, 4, and 5 illustrate, in cross-section, successive stages in the manufacture of the device.

We present now a description of the method that we have devised for building the structure shown in FIGS. 1 and 2. Referring first to FIG. 3, we show, in cross-section, a P type semiconductor body 1, generally, but not necessarily, silicon, covered with a thin layer of silicon oxide 9, approximately 200 Angstrom units thick. Also shown is part of a layer of photoresist 10 that serves as a mask during the implantation of N type dopant atoms (such as phosphorus or arsenic) to form the source region 2. The energy range of the ions during ion implantation is between 500 and 700 keV while the ion implantation dose is between 7E15 and 9E15 atoms/sq. cm. Also shown is part of a layer of field oxide (FOX) that is created by standard local oxidation of silicon (LOCOS) techniques (see, for example, VLSI Technology, by S. M. Sze, 2nd edition, page 136). The purpose of the FOX is to isolate the device from others on the same substrate.

Figure 4:
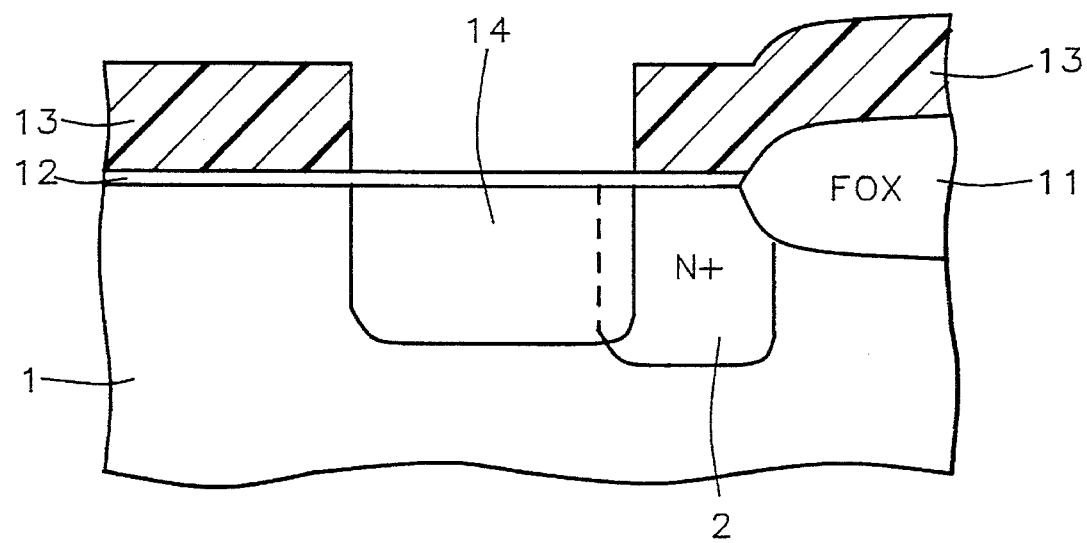

The next stage in the process is illustrated in FIG. 4. The photoresist layers shown in FIG. 3 are stripped away. A fresh layer of boron-doped silicon oxide 12 (thickness between 570 and 730 Angstrom units) is deposited on the surface and a new photoresist pattern 13 is layed down to define the area of the floating gate. A trench 14 is etched out of the silicon surface, using reactive ion etching, to approximately the same depth as the source 2, said trench being positioned so as to overlap source 2 by between 0.2 and 0.4 microns. After stripping off the photoresist, a short reflow cycle at 900° C. in nitrogen is used in order to ensure that the side walls of the boron-and-phosphorus doped oxide layer surrounding the top of the trench slope gently outwards, away from the trench.

Figure 5:
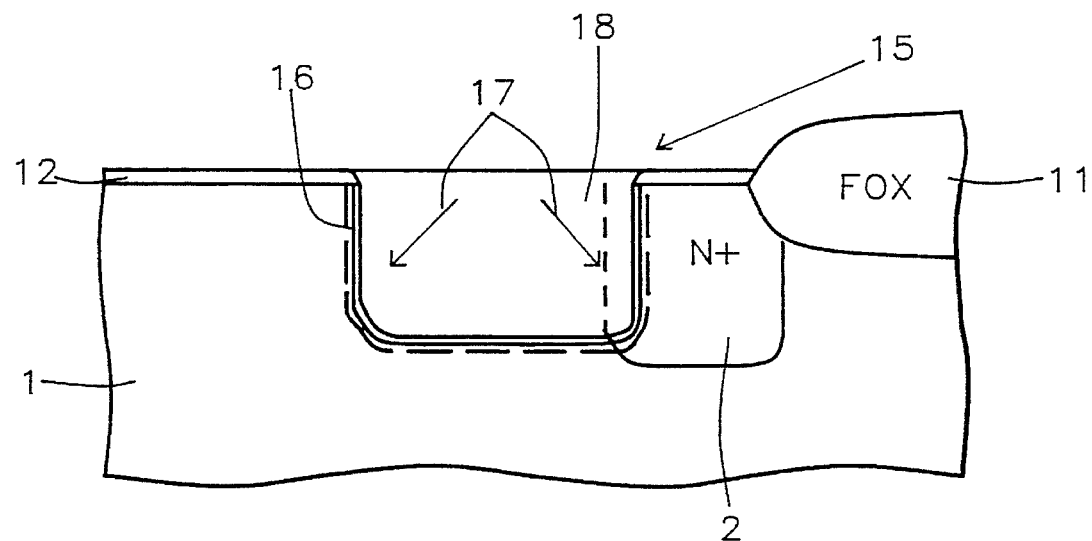

The appearance of the sloping wall 15 is illustrated in FIG. 5. The next step is to grow a layer of silicon oxide 16 (thickness between 130 and 170 Angstrom units) on the inside wall of the newly created trench. The region in the main silicon body, immediately surrounding the trench, will be where the effect of couping voltage (via the control gate) to the floating gate manifests itself. In order to optimize this effect (i.e. the threshold voltage of the channel under the floating gate) it is necessary to make this region more strongly P type. This is accomplished through angled ion implantation, with rotation, of boron through the sidewall (and its oxide) into the region in question. The angle at which the ions were directed at the trench walls was between 30 and 35 degrees of arc.

The angled ion implant is schematically illustrated by the arrows 17 in FIG. 5. Note that boron atoms will penetrate into the source region as well. The dopant level there is, however, high enough so that the boron atoms are overwhelmed and the section of the source in the vicinity of the floating gate remains N type. Continuing our reference to FIG. 5, the trench is filled with lightly doped N type polycrystalline silicon 18 (resistivity between 0.002 and 0.009 ohm cm.) by first overfilling and then etching back until the surface of the polycrystalline silicon is flush with the top surface of oxide layer 12.

Figure 6:
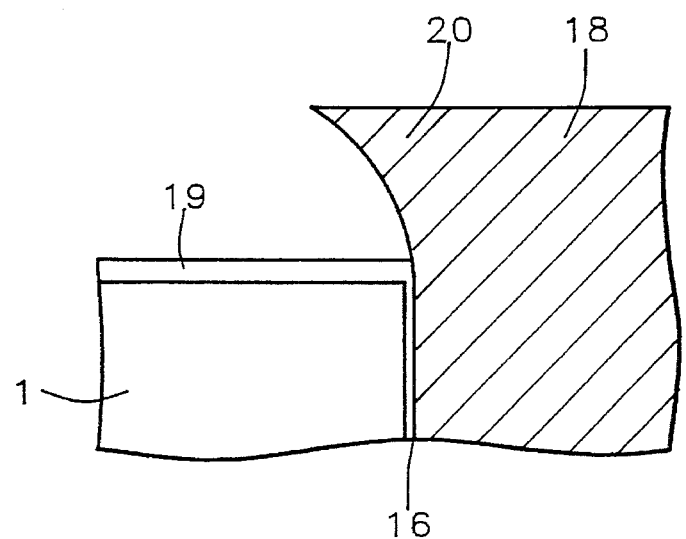
FIGS. 6 through 9 illustrate, via detailed cross-sections, how the sharp edged lip at the top of the floating gate is constructed.

The next step in the process is to etch away almost all of the silicon oxide layer 12 and about half of oxide layer 9, including the portion underlying the polycrystalline silicon, reducing its thickness to between 90 and 110 Angstrom units. A more detailed view of the structure in the vicinity of the filled trench, immediately after the etching of layer 12, is shown in FIG. 6. Silicon oxide layer 19 represents the etched back version of layer 9 while layer 16 is the original oxide layer that was grown on the inside of the trench prior to its being filled. Note that, as a result of the etch back, a free standing lip 20 of polycrystalline silicon has been created.

Figure 7:
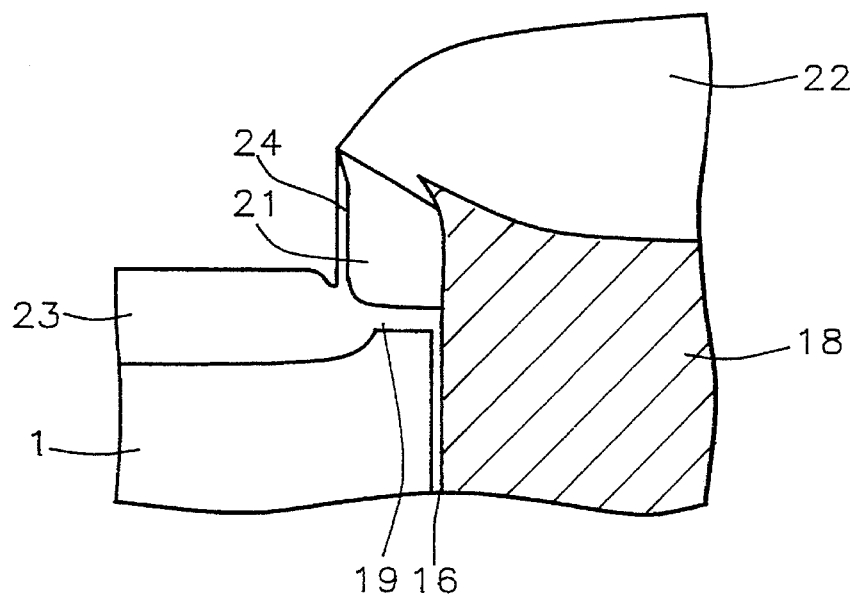

Now a layer of silicon nitride between 550 and 650 Angstrom units thick is deposited and then etched away everywhere except immediately underneath the free standing lip 20, so as to leave a wedge shaped layer 21 as shown in FIG. 7. The exposed surface of the filled-in trench as well as the surfaces immediately surrounding it are now subjected to oxidation. Because of its polycrystalline nature the top surface of the trench will grow oxide at a faster rate than will the single crystal surfaces around it. In this instance, the thickness of the oxide layer 22 above the trench was between 550 and 650 Angstrom units while the thickness of the oxide layer 23 on the surrounding surface was between 300 and 400 Angstrom units.

It should be noted that the oxide growth occurs both into as well as out of the trench's exposed surface. This has the beneficial effect of further shaping the edge of the overhanging lip as can be seen in FIG. 7 (compare with lip profile in FIG. 6). In the absence of the silicon nitride spacer that covers the underside of the lip, said underside would oxidize in a comparable manner to the top side and would choke off the lip's sharp edge. Additionally, a small amount of oxidation of the exposed silicon nitride surface occurs. In this instance, the layer 24 was between 20 and 50 Angstrom units thick.

Figure 8:
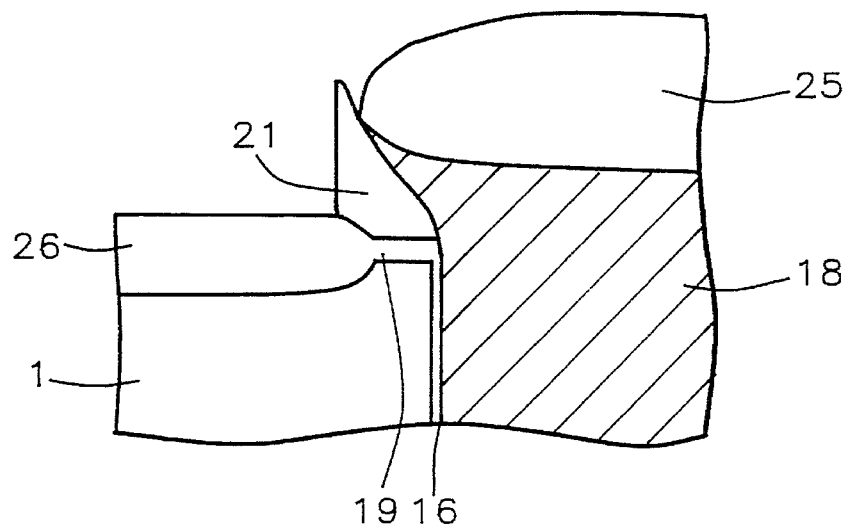

An isotropic silicon oxide etch is now given, sufficient to remove layer 24. Equivalent amounts of material will also be removed from layers 22 and 23. The appearance after this step is shown in FIG. 8. Layer 25 is the result of etching layer 22 while layer 26 is the result of etching layer 23.

Figure 9:
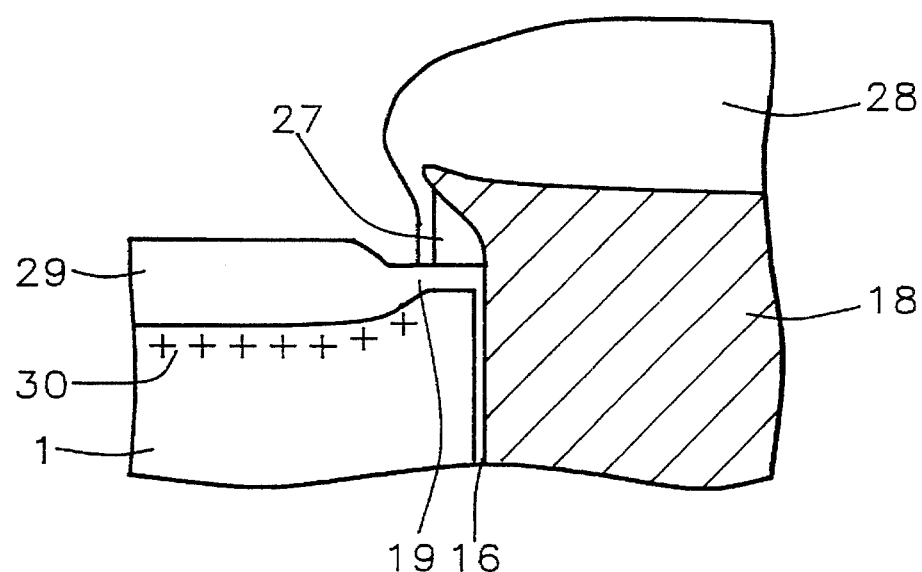

Next, an etchant specific to silicon nitride such as phosphoric acid at 160° C., is applied, reducing the thickness of the layer 21 to between 100 and 150 Angstrom units. Boron atoms are then ion implanted into the active region (between the floating gate and the drain) in order to optimize the threshold voltage, as described earlier for the inside of the trench prior to its being filled. About 150 Angstrom units of polycrystalline silicon oxide is grown at the tip in order to create polycrystalline silicon asperities that are necessary for efficient electron tunneling. A small amount of silicon oxide (between 150 and 250 Angstrom units) is then conformally deposited, followed by anisotropic removal of half of it, so that the appearance of the device in the vicinity of the lip is now as shown in FIG. 9. Wedge shaped layer 27 was layer 21 prior to the silicon nitride etch back, while layers 28 and 29 were layers 25 and 26 respectively prior to the last oxidation. Layer 30 (shown as a string of plus signs) is meant to schematically represent the implanted boron atoms just described.

Control gate 7, as shown in FIG. 1, can now be created by depositing between 3500 and 4500 Angstrom units of N type polycrystalline silicon having a resistivity between 0.0008 and 0.0012 ohm cm. and then patterning and etching it. Finally, the drain region 3 is formed through ion implantation of arsenic or phosphorus in the energy range 50 to 80 keV to a depth between 0.25 and 0.45 microns and with a dose between 6E13 and 1E14 atoms/sq. cm. for phosphorus and between 4E15 and 6E15 for arsenic.

Confirmation that the control-gate-to-floating-gate coupling ratio was reduced as a consequence of the fact that the floating-gate-to-source and floating-gate-to-substrate capacitances increased proportionally more than did the control-gate-to-floating-gate capacitance is shown by the following data in TABLE I that compare the factors by which the the relevant capacitances in the EEPROM of the present invention exceed those of a conventional EEPROM:

TABLE I

| CAPACITANCE BETWEEN FLOATING GATE AND | INCREASED BY A FACTOR OF |
| --- | --- |
| Source | 5.3–5.6 |
| Substrate | 3.9 |
| Control Gate | <2.2 |

As a consequence, the PROGRAM and ERASE voltages can be reduced to the values shown in TABLE II. The values in the column labelled as 'OLD' are taken from a paper by S. Kianian et al. page 71 of the 1994 Symposium on VLSI Technology Digest of Technical Papers entitled "A novel 3 volts only, small sector erase, high density flash EEPROM".

TABLE II

| | OLD | NEW |
| --- | --- | --- |
| PROGRAM pulse height (volts) | 10–20 | 8–10 |
| ERASE pulse height (volts) | 13–15 | 11.5–13.5 |

While the invention has been particularly shown and described with reference to the preferred embodiments thereof, it will be understood by those skilled in the art that various changes in form and details may be made without departing from the spirit and scope of the invention.

What is claimed is:

1. An Electrically Erasable and Programmable Read Only Memory device, formed within a semiconductor body, comprising:

an N type source region;

an N type floating gate region, located adjacent to said source region, extending below the surface to approximately the same depth as said source region and partially overlapping it, but being electrically isolated from it by a layer of insulating material that surrounds the floating gate, and extending above the surface by an amount sufficient to allow its exposed rim to have the shape of a lip that overhangs the surrounding surface;

a layer of silicon nitride located between the surface of the semiconductor body and the underside of said overhanging lip;

an N type drain region adjacent to, but not overlapping, said floating gate and located on that side of said floating gate that does not overlap said source region; and a control gate located above, and overlapping, both said drain region and said floating gate but separated from them by a layer of insulating material.

2. The structure described in claim 1 wherein the depth of the source region below the surface of the semiconductor body is between 1.3 and 1.5 microns.

3. The structure described in claim 1 wherein the floating gate is composed of polycrystalline silicon whose resistivity is between 0.002 and 0.009 ohm cm.

4. The structure described in claim 1 wherein the thickness of the insulating layer that surrounds the floating gate is between 130 and 170 Angstrom units.

5. The structure described in claim 4 where the insulating layer is composed of silicon oxide.

6. The structure described in claim 1 wherein the overhanging lip of the floating gate extends outward for a distance that is not less than about 180 Angstrom units.

7. The structure described in claim 1 wherein the shape of the edge of the overhanging lip of the floating gate is such that the angle defined by the intersection of its upper and lower surfaces is not greater than about 60 degrees of arc.

8. The structure described in claim 1 wherein the silicon nitride film, located between the underside of the overhanging lip and the surface, extends outward from the intersection of the lip's underside with the surface for a distance of between 100 and 150 Angstrom units.

9. The structure described in claim 1 wherein the distance separating the drain region from the floating gate is between 0.42 and 0.52 microns.

10. The structure described in claim 1 wherein the control gate is composed of polycrystalline silicon having a resistivity between 0.0008 and 0.0012 ohm cm. and a thickness between 0.35 and 0.45 micron.

11. The structure described in claim 1 wherein the thicknesses of the insulating layers that separate the control gate from the floating gate and drain region are between 600 and 700 Angstrom units and between 350 and 430 Angstrom units pespectively.

12. The structure described in claim 11 wherein the insulating layer is composed of silicon oxide.

13. A method for forming an Electrically Erasable and Programmable Read Only Memory (EEPROM) device within a semiconductor body, comprising:

implanting N type dopant material, through a mask, into said semiconductor body so as to create a source region;

etching a trench into said semiconductor body to approximately the same depth as said source region, said trench to be positioned so as to remove a portion of said source region and the etching to be performed in a manner that will lead to the creation of a sloping sidewall at the intersection of said trench with the surface;

optimizing the threshold voltage of the trench surface by implanting P type dopant material into its walls;

filling said trench with a first layer of polycrystalline silicon that has been lightly doped as N type, the amount of polycrystalline silicon being sufficient to ensure that the aforementioned sloping portion of said trench's surface is covered;

etching away all but a thin residue of the surface layer of silicon oxide so as to leave the topmost edge of said first layer of polycrystalline silicon as a free standing lip extending outwards in cantilever fashion above the surface of the semiconductor body;

depositing a spacer layer of silicon nitride in the wedge shaped region underneath said free standing lip;

partially etching back said layer of silicon nitride and then oxidizing the exposed portions of said filled-in trench, including the top surface of said free standing lip;

implanting, through a mask, atoms of a P type dopant so as to lightly dope said semiconductor body, just below its surface, in the area surrounding said filled trench;

growing a layer of silicon oxide so that the tip of the polycrystalline silicon lip is completely covered by oxide without, at the same time, significantly increasing the thickness of silicon oxide on other parts of the surface;

depositing, and then etching through a mask, a second layer of polycrystalline silicon so as to form a control gate for the device; and implanting N type dopant atoms into said semiconductor body, through a mask, so as to create a drain region for the device.

14. The method of claim 13 where the N type dopant used to create the source region is phosphorus implanted through ion implantation in the energy range 500 to 700 keV with a dose between 7E15 and 9E15 atoms/sq. cm.

15. The method of claim 13 where the N type dopant used to create the source region is arsenic implanted through ion implantation in the energy range 500 to 700 keV with a dose between 7E15 and 9E15 atoms/sq. cm.

16. The method of claim 13 where the depth of the source region is between 1.3 and 1.5 microns.

17. The method of claim 13 where the technique that is used to create the sloping side wall of the trench is reflow of boron-and-phosphorus doped oxide.

18. The method of claim 13 where the P type doping of the walls of the trench is achieved through use of angled ion implantation in the energy range 40 to 80 keV with a dose between 1E11 and 3E11 atoms/sq. cm.

19. The method of claim 13 where the resistivity of the lightly doped N type silicon used to fill in the trench is between 0.002 and 0.009 ohm cm.

20. The method of claim 13 where the silicon nitride layer that is deposited in the empty wedge shaped region underneath the free standing lip is deposited by means of low pressure chemical vapor deposition to a thickness that is between 550 and 650 Angstrom units.

21. The method of claim 20 where the thickness of the silicon nitride layer is, after it has been etched back, between 100 and 150 Angstrom units.

22. The method of claim 13 where the P type dopant that is used to dope the semiconductor body just below its surface in the area surrounding the filled-in trench is applied through ion implantation in the energy range 80 to 100 key at a dose between 0.3E13 and 1.2E13 atoms/sq. cm.

23. The method of claim 13 where the thickness of the silicon oxide layer that coats the layer of silicon nitride is between 150 and 250 Angstrom units while the thickness of the silicon oxide under the control gate is between 350 and 430 Angstrom units.

24. The method of claim 13 where a plurality of the devices are created within the semiconductor body simultaneously.

* * * * *